(12) United States Patent
Shibata et al.

(10) Patent No.: US 6,933,169 B2
(45) Date of Patent: *Aug. 23, 2005

(54) OPTICAL SEMICONDUCTOR DEVICE

(75) Inventors: Naoki Shibata, Aichi-ken (JP); Makoto Asai, Aichi-ken (JP)

(73) Assignee: Toyoda Gosei Co., Ltd., Aichi (JP)

( * ) Notice: Subject to any disclaimer, the term of this patent is extended or adjusted under 35 U.S.C. 154(b) by 30 days.

This patent is subject to a terminal disclaimer.

(21) Appl. No.: 10/370,458

(22) Filed: Feb. 24, 2003

(65) Prior Publication Data

US 2003/0122251 A1 Jul. 3, 2003

Related U.S. Application Data

(62) Division of application No. 09/680,461, filed on Oct. 6, 2000, now Pat. No. 6,573,114, which is a division of application No. 08/615,858, filed on Mar. 12, 1996, now Pat. No. 6,191,436.

(30) Foreign Application Priority Data

Mar. 13, 1995 (JP) ............................................ 7-081948

(51) Int. Cl.$^7$ ............................................... H01L 33/00
(52) U.S. Cl. ....................................................... 438/91
(58) Field of Search ................... 257/91–103, 745–749; 438/9–103

(56) References Cited

U.S. PATENT DOCUMENTS 5,550,391 A   8/1996   Yamaguchi

FOREIGN PATENT DOCUMENTS

EP          0622858 A2      11/1994
JP          6-232450        8/1994

*Primary Examiner*—Savitri Mulpuri
(74) *Attorney, Agent, or Firm*—McGinn & Gibb, PLLC

(57) ABSTRACT

A LED has a thin highly resistive or insulative layer formed below an electrode pad in order to divert current flow from the region below an electrode pad, which region does not contribute to light emission, to another region which does. Consequently, better current efficiency is obtained. Further, diverting current flow from the region below the electrode pad where mechanical damages are expected deters deterioration of the region. Consequently, the LED lasts longer and is a better quality product.

8 Claims, 4 Drawing Sheets

OPTICAL SEMICONDUCTOR DEVICE

The Application is a Divisional Application of U.S. patent application Ser. No. 09/680,461, filed on Oct. 6, 2000, now U.S. Pat. No. 6,573,114, which was a Divisional Application of U.S. patent application Ser. No. 08/615,858, filed on Mar. 12, 1996, now U.S. Pat. No. 6,191,436.

BACKGROUND OF THE INVENTION

1. Field of the Invention

The present invention relates to a light-emitting semiconductor device (LED) or an optical semiconductor device including a light detection device and so on which has at least one p-n junction structure. Especially, the invention relates to an optical semiconductor device which has a highly resistive region to control the flow of current.

2. Description of the Related Art

Conventionally, an electrode of an optical semiconductor device, especially a nitrogen compound LED having at least one of gallium (Ga), aluminum (Al), and indium (In) therein, is formed at a corner of the semiconductor chip so as not to effectively interfere with light produced by the device. The electrode is formed using bonding processes.

However, an opaque electrode pad is formed on some part or area of the electrode so that emission light from an area below the electrode pad is unable to contribute to luminous intensity of the device. The electric current which contributes to such blocked light is thus not used effectively.

Such unnecessary current flow causes the LED to age, because the region below the electrode pad is expected to be mechanically damaged at the time of wire bonding and the unnecessary current flow through that region increases the deterioration of the LED. As a result, the life span of the LED is limited, making the LED an unreliable product.

SUMMARY OF THE INVENTION

It is, therefore, an object of the present invention to improve the efficiency of applied current to an LED.

It is another object of the present invention to improve the quality of the LED.

According to a first aspect of the invention, an optical semiconductor device is provided having a p-n junction structure made of an n-layer and a p-layer, an electrode pad for wire bonding and a highly resistive region below the electrode pad.

According to a second aspect of the invention, the highly resistive region is made of silicon oxide ($SiO_2$).

According to a third aspect of the invention, the highly resistive region is formed as some part of or an area of the p-layer, before the p-layer is processed to exhibit p-type conduction.

According to a fourth aspect of the invention, the highly resistive region is formed by annealing over the electrode pad after the electrode pad is formed.

According to a fifth aspect of the invention, the highly resistive region is formed by ion implantation and/or impact which diffuses insulators into some part or area of the p-layer.

According to a sixth aspect of the invention, the optical semiconductor device comprises a nitride compound semiconductor LED having at least one of aluminum (Al), gallium (Ga) and indium (In).

The highly resistive region or insulative region formed below the electrode pad redirects the applied current from that region to the semiconductor layers. Consequently, less current is wasted and better efficiency of applied current is obtained by the arrangements of the present invention as compared to a conventional device with the same amount of current being applied.

The arrangements of the present invention also improve the quality of the semiconductor device. By decreasing the current flow in the vicinity of mechanical damages that were made at the time of wire bonding, deterioration of the device can be inhibited. As a result, the product life span of the device is longer, or its quality is improved as a whole. This improvement may be observed by performing an accelerating deterioration exam.

Other objects, features, and characteristics of the present invention will become apparent upon consideration of the following description in the appended claims with reference to the accompanying drawings, all of which form a part of the specification, and wherein referenced numerals designate corresponding parts in the various figures.

DETAILED DESCRIPTION OF THE EXEMPLARY EMBODIMENTS

The invention will be more fully understood by reference to the following examples.

EXAMPLE 1

Figure 1:
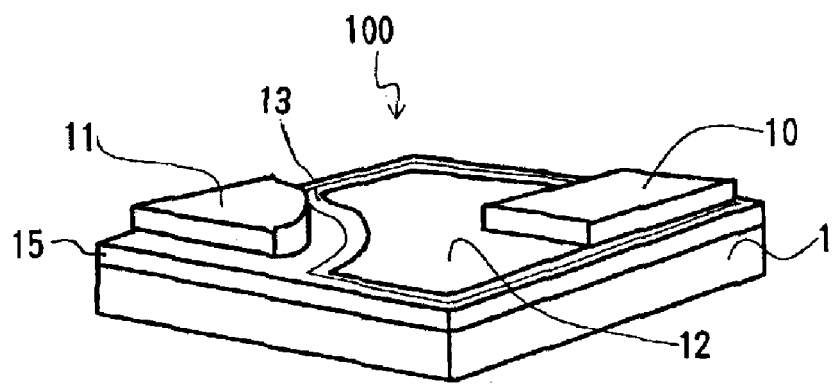
FIG. 1 is a perspective view of the structure of a gallium nitride compound semiconductor LED in Example 1.
Figure 2:
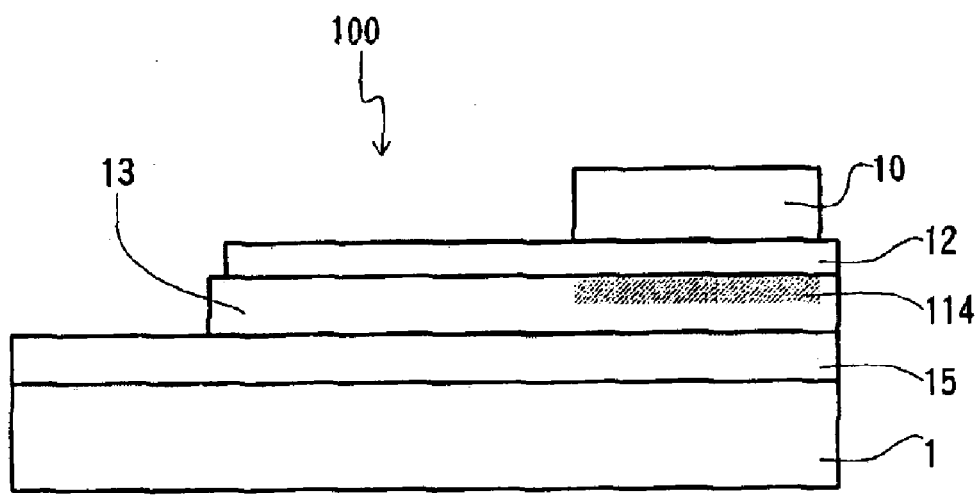
FIG. 2 is a sectional view of the LED in Example 1.

FIGS. 1 and 2 show an LED 100 made of gallium nitride compound materials. As shown in FIG. 2, the LED 100 has a sapphire substrate 1 which has an n-layer 15 and a p-layer 13 successively thereon. Both the n-layer 15 and the p-layer 13 may comprise a conventionally known multi-layer structure. Together they form a p-n junction structure. A transparent electrode 12 is formed on the p-layer 13. An electrode pad 10 is formed on some part or area of the electrode 12. Another electrode pad 11 which also functions as an electrode is formed on an exposed area or part of the n-layer 15. Bonding wires or lead lines (not shown) connect each of the electrode pads 10 and 11 with land terminals of lead pins (not shown) by a wedge bonding method for electric contact.

Since the electrode pad 10 was made of metal and was formed on some part or area of the transparent electrode 12, some region of the semiconductor layers just below the electrode pad 10 cannot be seen from the top surface. Namely, light emitted from that region cannot be effectively utilized, because the emitted light is reflected or refracted toward unintended directions and/or absorbed into the semiconductor layers.

In this embodiment, a thin highly resistive layer or region 114 was formed just below the electrode pad 10 taking the shape of the electrode pad 10 and having a horizontal cross-sectional area equal to that of the electrode pad 10. In other words, the highly resistive layer has a lateral periphery which is the same shape and size as a lateral periphery of the electrode pad, and the lateral periphery of the resistive layer is directly below and in alignment with that of the electrode pad. Applied current is diverted from the highly resistive layer or region 114 and flows through the transparent electrode 12 into semiconductor layers. Consequently, the efficiency is obtained as compared to a conventional device with the same amount of applied current.

Figure 3A:
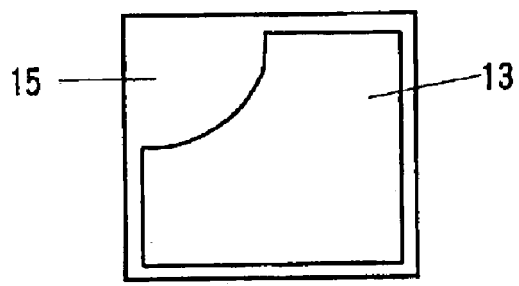
FIGS. 3A to 3D are explanatory diagrams showing a manufacturing process of the LED in Example 1.

Referring to FIGS. 3A to 3D, manufacturing processes of the LED 100 are explained hereinafter. As shown in FIG. 3A, a p-n junction structure was formed on each chip of a wafer by conventional manufacturing processes. The layer 13 remains insulative at this stage. Then, an area or a part where the electrode pad 11 would be formed was exposed by reactive ion etching (RIE).

Figure 3B:
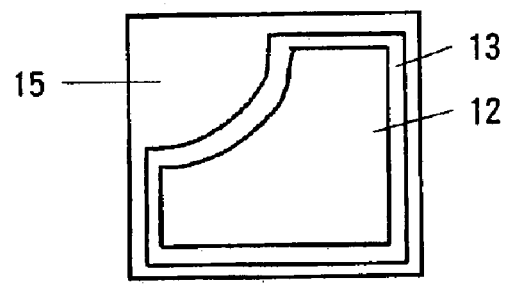

As shown in FIG. 3B, the transparent electrode 12 was then formed on the layer 13 which would exhibit p-type conduction. The transparent electrode 12 was formed to follow the shape of the layer 13, and it was made of 20 Å thick nickel (Ni) and a 50 Å thick gold (Au) thereon. In order to prevent a short circuit, the periphery of the transparent electrode 12 was formed to be a little smaller than that of the layer 13.

The preferable thickness of Ni and Au for the electrode 12 range from 10 Å to 60 Å and from 5 Å to 100 Å, respectively. It is preferred that the thickness of Ni and Au not be thinner than 10 Å and 5 Å respectively, because thin thickness of the electrode 12 results in high resistivity and prevents plane emission of the device. It is preferred that the thickness of Ni and Au not be thicker than 60 Å and 100 Å, respectively, because transparency of the electrodes drops and prevents effective light emission.

Figure 3C:
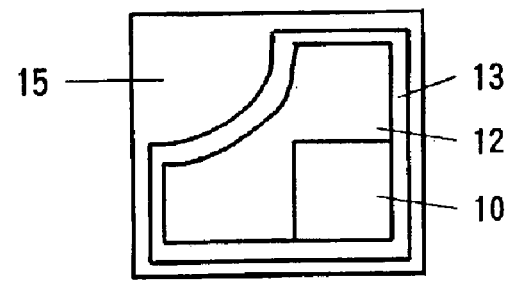

As shown in FIG. 3C, the electrode pad 10 made of 1000 Å thick nickel (Ni) and 1.2 µm thick gold (Au) thereon was formed on part of or an area of the electrode 12 at a corner located opposite to the exposed n-layer 15.

Ni and Au may be utilized as materials forming part of the electrode 12 and the electrode pad 10. Alternatively, aluminum (Al), titanium (Ti), tantalum (Ta), or any combinations of aluminum (Al), titanium (Ti), and tantalum (Ta) can be utilized.

Figure 3D:
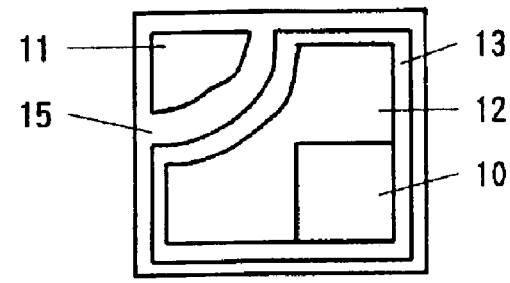

As shown in FIG. 3D, the electrode pad 11 for the n-layer 15 was formed on the exposed portion of the n-layer 15 forming an electrical contact therewith.

Then, annealing or alloying was carried out in the atmosphere of nitrogen gas with an ultraviolet ray lamp at the temperature of 560° C. for 1 min. in order to improve the respective ohmic properties between the electrode pad 11 and the n-layer 15, and between the transparent electrode 12 and the electrode pad 10.

Further, through that annealing process, the highly resistive layer 14 having a lateral periphery of the same shape and size as that of the electrode pad 10 was maintained in alignment just below the transparent electrode 12. Since the electrode pad 10 had a large thermal capacity, it absorbed and stopped conveying heat thereunder. As a result, some region or area of the p-layer 13 which is just under the electrode pad 10 remained insulative. The rest of the p-layer 13 is changed to exhibit p-type conduction, because of the annealing process. As a result, the applied current flowed efficiently through the transparent electrode 12, being diverted from the highly resistive layer 14.

The LED 100 was found to have a luminous intensity of 1200 mcd to 1300 mcd while that of the conventional LED was 1000 mcd.

The preferable conditions for annealing are a temperature from 500° C. to 700° C. in an atmosphere of nitrogen gas for a period of 0.1 min. to 10 min.

EXAMPLE 2

Figure 4:
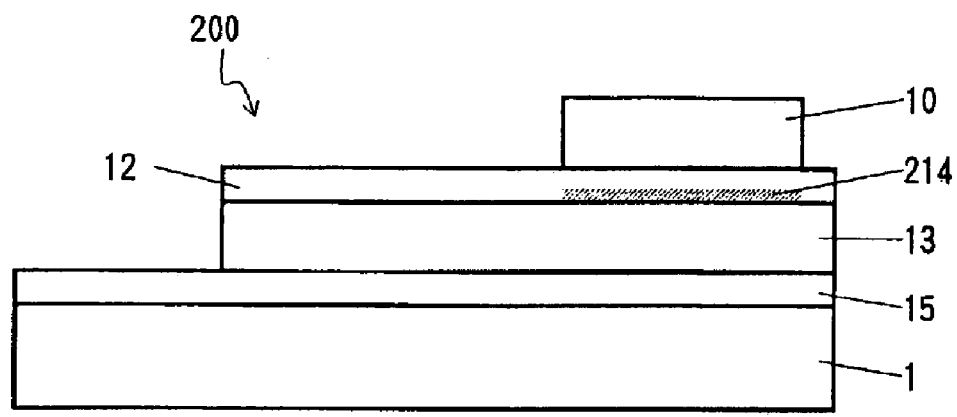
FIG. 4 is a sectional view showing the structure of the LED in Example 2.

FIG. 4 shows an LED 200 made of gallium nitride group compound in accordance with Example 2. The arrangement and manufacturing method which can be provided to prevent electric current from flowing just below the electrode pad 10 are not limited to those described in Example 1. For example, a highly resistive region may be formed below the electrode pad 10 in any way. In the LED 200 of Example 2, a thin silicon oxide ($SiO_2$) layer 214 was formed on some part or area of the p-layer 13 where the electrode pad 10 would be formed above. After the transparent electrode 12 was formed on the p-layer 13 and the highly resistive layer 214, an electrode pad 10, having a lateral periphery with the same shape and size as a lateral periphery of the highly resistive layer 214, was formed on some part or area of the electrode 12. Electric current does not flow under the electrode pad 10, but flows where there is no highly resistive region, or where recombination of electrons and holes most likely occurs. Therefore, most of the electric current flows through the transparent electrode 12 at a position diverted from the silicon oxide layer 214, and thus contributes to light emission that can be utilized.

The LED 200 was found to have a luminous intensity of 1200 mcd to 1300 mcd while that of the conventional LED was 1000 mcd.

EXAMPLE 3

Figure 5:
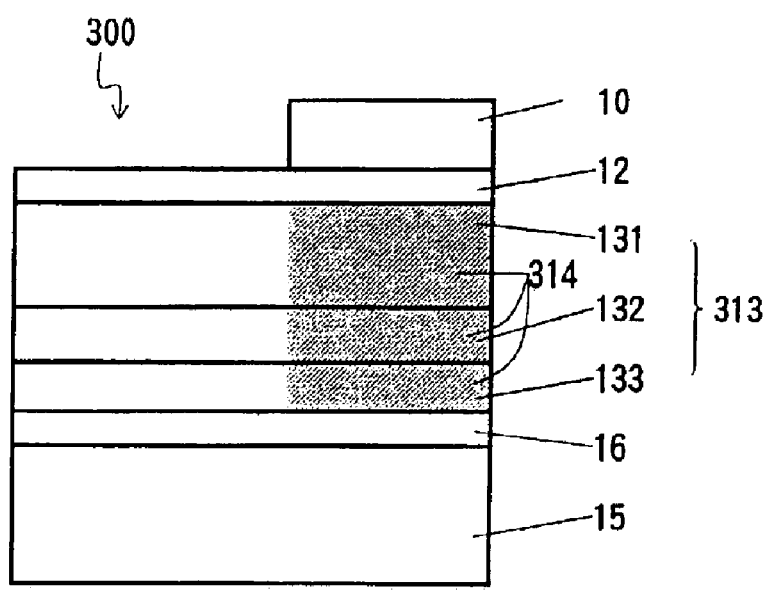
FIG. 5 is a sectional view showing the structure of the LED in Example 3.

FIG. 5 shows an LED 300 made of a gallium nitride group compound in this embodiment. A highly resistive layer 314 is formed during the manufacturing processes of a p-n junction structure.

The LED 300 has an emission layer 16 between the n-layer 15 and a p-layer 313. The p-layer 313 has a triple layer structure successively comprising a magnesium (Mg) doped AlGaInN clad layer 133, a Mg-doped GaN layer 132, and a Mg-doped GaN layer 131 which is heavily doped with Mg relative to the GaN layer 132. Those three layers 133, 132, and 131 exhibit insulative characteristics without heat annealing or electron irradiation. Other layers and remaining-structures of the LED 300 are as same as those of the LEDs 100 and 200 in Examples 1 and 2, respectively.

The highly resistive region 314 was formed below the electrode pad 10 and the electrode 12 utilizing some part or area of the three layers 133, 132, and 131. Electron irradiation and/or heat annealing was carried out to obtain p-type conduction, masking or covering the area of the electrode pad 10 with an insulative film made of silicon oxide ($SiO_2$) (not shown). Even after p-type conduction is obtained, the insulative film may be used as a passivation film for insulation without being removed.

Since the LED 300 has the insulative emission layer 16 between the n-layer 15 and the p-layer 313 and the highly resistive region 314 under the electrode pad 10, most of the current applied to the LED 300 flows through the p-type region of the p-layer 313. Consequently, applied current effectively contributes to light emission at a semiconductor region to the side of the region below the electrode pad 10.

The obtained LED 300 was found to have a luminous intensity of 1200 mcd to 1300 mcd while that of the conventional LED was 1000 mcd.

EXAMPLE 4

Figure 6:
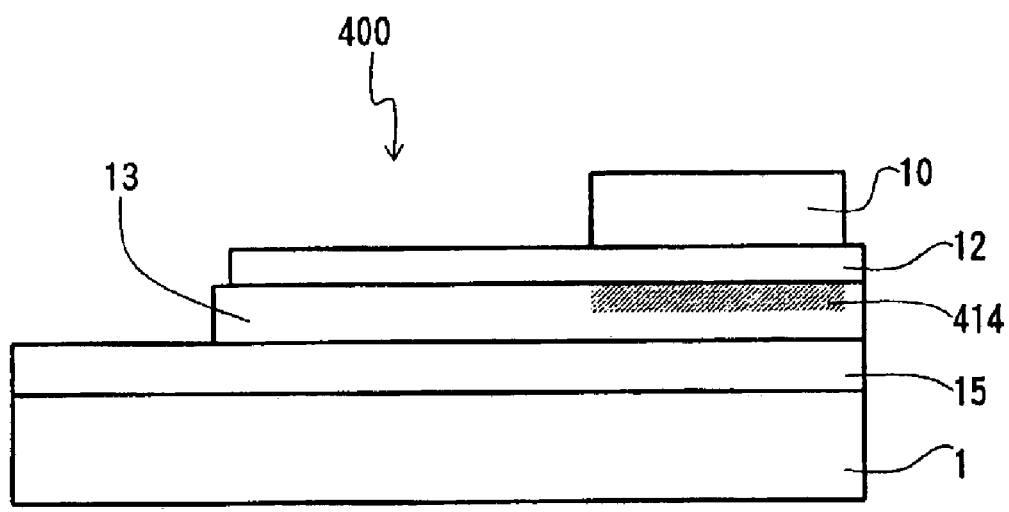
FIG. 6 is a sectional view showing the structure of the LED in Example 4.

FIG. 6 shows an LED 400 in this embodiment which generally has the same structure as the LED 100 in Example 1. Differences between the LEDs 100 and 400 reside in the processes used to manufacture the highly resistive regions 114 and 414. In this embodiment, ion implantation and/or impact was utilized for obtaining the highly resistive region 414 by diffusing an insulator into some part or area of the p-layer 13 where the electrode pad 10 would be formed above.

The obtained LED 400 was found to have a luminous intensity of 1200 mcd to 1300 mcd while that of the conventional LED was 1000 mcd.

Although each of Examples 1 to 4 are directed to LEDs, the present invention may also be embodied in an optical semiconductor device including a light detection semiconductor device, comprising a light-detection side and an electrode pad attached to a surface of the light-detection side.

While the invention has been described in connection with specific exemplary embodiments, it is to be understood that the invention is not to be limited to the disclosed embodiments. Rather, the present invention is intended to include various modifications and equivalent arrangements, such as those that are within the spirit and scope of the appended claims. For example, a highly resistive layer may not correspond precisely in size and shape to an electrode pad, and/or it may not be precisely aligned/positioned directly below the electrode pad.

What is claimed is:

1. An optical semiconductor device comprising:

a p-n junction structure having an n-layer and a p-layer;

one of a light-emitting side and a light-detection side;

a transparent electrode film capable of passing light therethrough formed on one of said light-emitting side and said light-detecting side;

an electrode pad for wire bonding formed on said transparent electrode and located on one of said light-emitting side and said light-detection side; and a highly resistive region through which current cannot pass located below said electrode pad and having a lateral periphery substantially corresponding in shape and size to a lateral periphery of said electrode pad, wherein said highly resistive region comprises an insulative layer.

2. An optical semiconductor device comprising:

a p-n junction structure having an n-layer and a p-layer;

one of a light-emitting side and a light-detection side;

an electrode pad for wire bonding located on one of said light-emitting side and said light-detection side; and a highly resistive region through which current cannot pass located below said electrode pad and having a lateral periphery substantially corresponding in shape and size to a lateral periphery of said electrode pad, wherein said highly resistive region is formed as part of said p-layer before said p-layer is processed to exhibit p-type conduction.

3. An optical semiconductor device comprising:

a p-n junction structure having an n-layer and a p-layer;

one of a light-emitting side and a light-detection side;

an electrode pad for wire bonding located on one of said light-emitting side and said light-detection side; and a highly resistive region through which current cannot pass located below said electrode pad and having a lateral periphery substantially corresponding in shape and size to a lateral periphery of said electrode pad, wherein said highly resistive region is formed by annealing over said electrode pad.

4. An optical semiconductor device comprising:

a p-n junction structure having an n-layer and a p-layer;

one of a light-emitting side and a light-detection side;

an electrode pad for wire bonding located on one of said light-emitting side and said light-detection side; and a highly resistive region through which current cannot pass resistive region located below said electrode pad and having a lateral periphery substantially corresponding in shape and size to a lateral periphery of said electrode pad, wherein said highly resistive region is formed by at least one of ion implantation and impact.

5. An optical semiconductor device of claim 2, wherein said optical semiconductor device comprises a nitride compound light-emitting semiconductor device having at least one of aluminum (Al), gallium (Ga), and indium (In).

6. An optical semiconductor device of claim 3, wherein said optical semiconductor device comprises a nitride compound light-emitting semiconductor device having at least one of aluminum (Al), gallium (Ga), and indium (In).

7. An optical semiconductor device of claim 4, wherein said optical semiconductor device comprises a nitride compound light-emitting semiconductor device having at least one of aluminum (Al), gallium (Ga), and indium (In).

8. An optical semiconductor device according to claim 1, wherein said highly resistive region comprises a silicon dioxide ($SiO_2$) layer.

* * * * *